United States Patent
Scranton et al.

(10) Patent No.: US 6,374,837 B2
(45) Date of Patent: Apr. 23, 2002

(54) SINGLE SEMICONDUCTOR WAFER PROCESSOR

(75) Inventors: Dana Scranton; Gary L. Curtis, both of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/859,930

(22) Filed: May 17, 2001

Related U.S. Application Data

(62) Division of application No. 09/416,225, filed on Oct. 8, 1999.

(51) Int. Cl.⁷ ................................................. B08B 3/00
(52) U.S. Cl. .................... 134/161; 134/135; 134/902
(58) Field of Search ................................. 134/135, 148, 134/153, 161, 902

(56) References Cited

U.S. PATENT DOCUMENTS

| | | | | |
|---|---|---|---|---|
| 3,727,620 A | * | 4/1973 | Orr | ............................ 134/95 |
| 4,722,752 A | * | 2/1988 | Steck | ......................... 134/25.4 |
| 5,022,419 A | * | 6/1991 | Thompson et al. | ......... 134/102 |
| 5,421,905 A | * | 6/1995 | Ueno et al. | ................ 134/25.4 |
| 5,487,398 A | * | 1/1996 | Ohmi et al. | ............... 134/95.1 |
| 5,807,439 A | * | 9/1998 | Akatsu et al. | ................ 134/32 |
| 6,179,930 B1 | * | 1/2001 | Ide et al. | ....................... 134/19 |

* cited by examiner

Primary Examiner—Zeinab El-Arini
(74) Attorney, Agent, or Firm—Lyon & Lyon LLP

(57) ABSTRACT

An apparatus for processing or drying a semiconductor wafer includes a rotor for holding a wafer and for spinning the wafer about a first axis. A pivot arm supports the rotor, so that the rotor can pivot about a second axis that is substantially perpendicular to the first axis. A basin holding a processing fluid is located below the rotor, with the rotor vertically movable into and out of the processing fluid via an elevator supporting the pivot arm. The rotor is pivotable into a position where it holds the wafer at an inclined angle so that the wafer may be withdrawn from the processing fluid at said inclined angle to facilitate drying of the wafer.

20 Claims, 3 Drawing Sheets

SINGLE SEMICONDUCTOR WAFER PROCESSOR

This Application is a Division of U.S. patent application Ser. No. 09/416,225, filed Oct. 8, 1999, now pending, and incorporated herein by reference.

FIELD OF THE INVENTION

The field of the invention is manufacturing semiconductor wafers and similar articles.

BACKGROUND OF THE INVENTION

Semiconductor devices are used in a wide range of consumer electronics, computers, communication equipment, and various other products. Semiconductor devices are generally made from wafers of silicon, or other semiconductor materials. The wafers are processed through many manufacturing steps, to form microelectronic circuits. During various steps in manufacturing, the wafers are processed using fluid chemicals (e.g., acids, caustics, etchants, photoresists, plating solutions, etc.). They are also rinsed and dried, to remove contaminants which can cause defects in the end product devices or interfere with subsequent process steps. However, the processing or rinsing fluids themselves have potential for unintentionally depositing a residue or particulate contaminants on the wafer, if fluid dries on the wafer surface. Thus, fluid is preferably removed quickly and completely from the wafer.

Deionized ("DI") water is frequently used as a rinsing fluid. DI water, as well as other fluids used in manufacturing semiconductors, will cling to wafer surfaces in sheets or droplets, due to surface tension. Consequently, the surface tension forces must be overcome to remove the sheets or droplets, and to thereby leave no fluid-borne contaminants on the wafer surfaces.

Various approaches have been used in the past to reduce the level of contaminants left on the wafer surface after processing or rinsing and drying. These include spin rinser machines, alcohol vapor machines, as well as equipment using combinations of spin, alcohol, and heat. While several of these approaches have performed well, there is a need for improved processing and drying methods and equipment.

SUMMARY OF THE INVENTION

In a first aspect of the invention, a method for processing a semiconductor article includes the steps of withdrawing the article from a processing fluid at an inclined angle. The article is withdrawn at a selected withdrawal rate. The article is advantageously exposed to a vapor of an organic solvent. After the wafer is completely withdrawn from the fluid, the wafer is spun momentarily, via a rotor, to centrifugally remove any fluid remaining on the wafer.

In a second aspect of the invention, a dry gas, such as nitrogen, is mixed with the vapor.

In a third aspect of the invention, the spin time of the wafer is limited, to avoid drying fluid on the wafer.

In a fourth aspect of the invention, an apparatus for drying a semiconductor article, such as a wafer, includes a lid attached to a body. A basin in the body holds a rinsing liquid. A rotor within the body, above the basin, has a spin motor for spinning a wafer. An elevator attached to the rotor moves the rotor vertically, to immerse and withdraw a wafer from the rinsing liquid. A pivot motor in the elevator pivots the rotor into a face up position, for loading and unloading a wafer, and into a downwardly inclined position, so that the wafer is withdrawn from the liquid at an inclined angle.

BRIEF DESCRIPTION OF THE DRAWINGS

Other objects and advantages of the invention will become apparent from the drawing figures, which are provided by way of example, and should not be interpreted as limits of the invention.

In the drawings, wherein the same reference number denotes the same element, throughout all of the views.

DETAILED DESCRIPTION OF THE DRAWINGS

Figure 1:
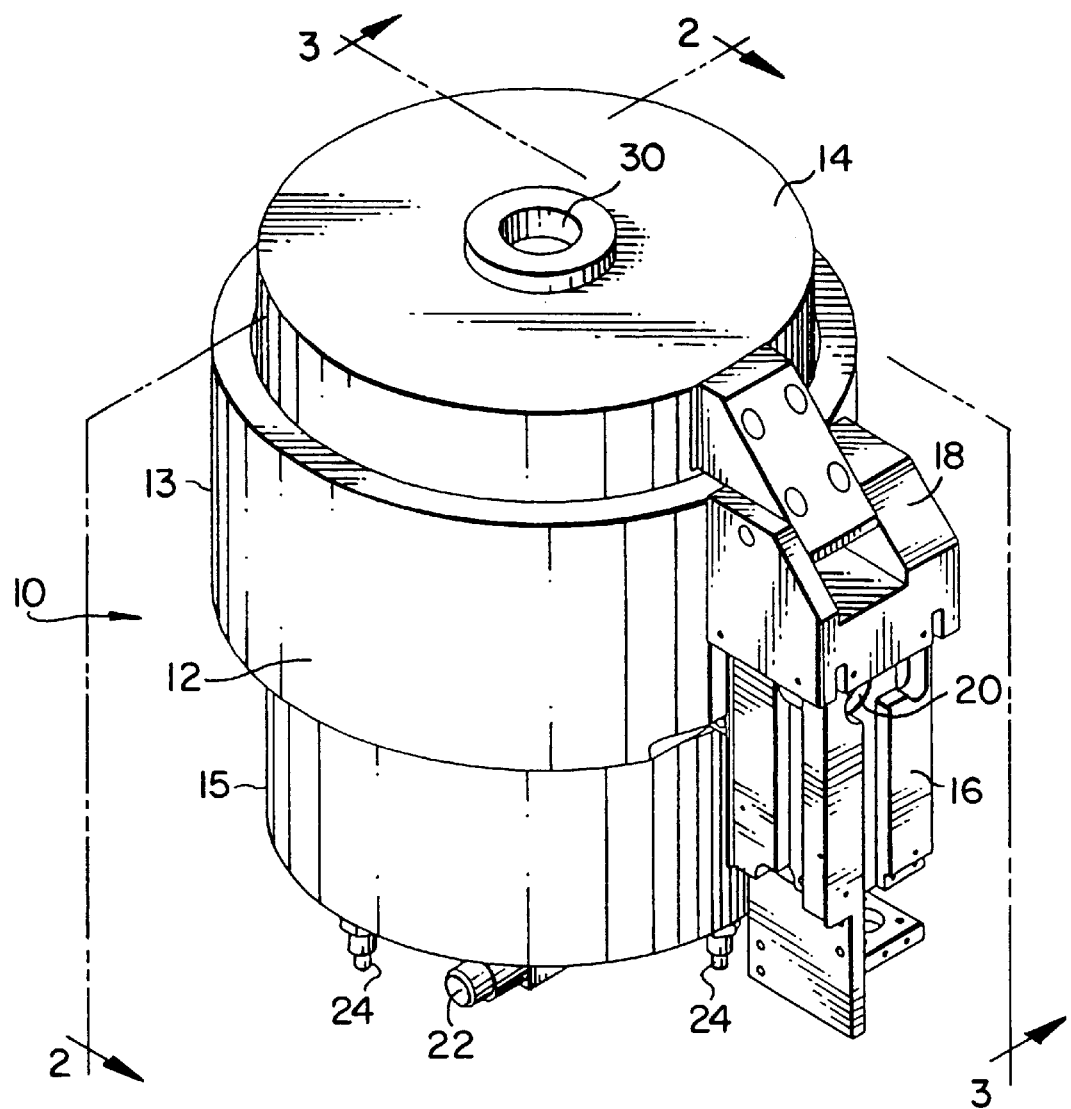
FIG. 1 is a perspective view of the invention.

Turning now into detail to the drawings, as shown in FIG. 1, the processor 10 of the invention has a body 12 having upper and lower cylindrical side walls 13 and 15. A lid 14 is pivotably attached to the body 12. A lid motor or actuator 18 attached to the body 12 raises and lowers the lid 14, or pivots the lid 14 upwardly, to open and close the body 12.

Figure 2:
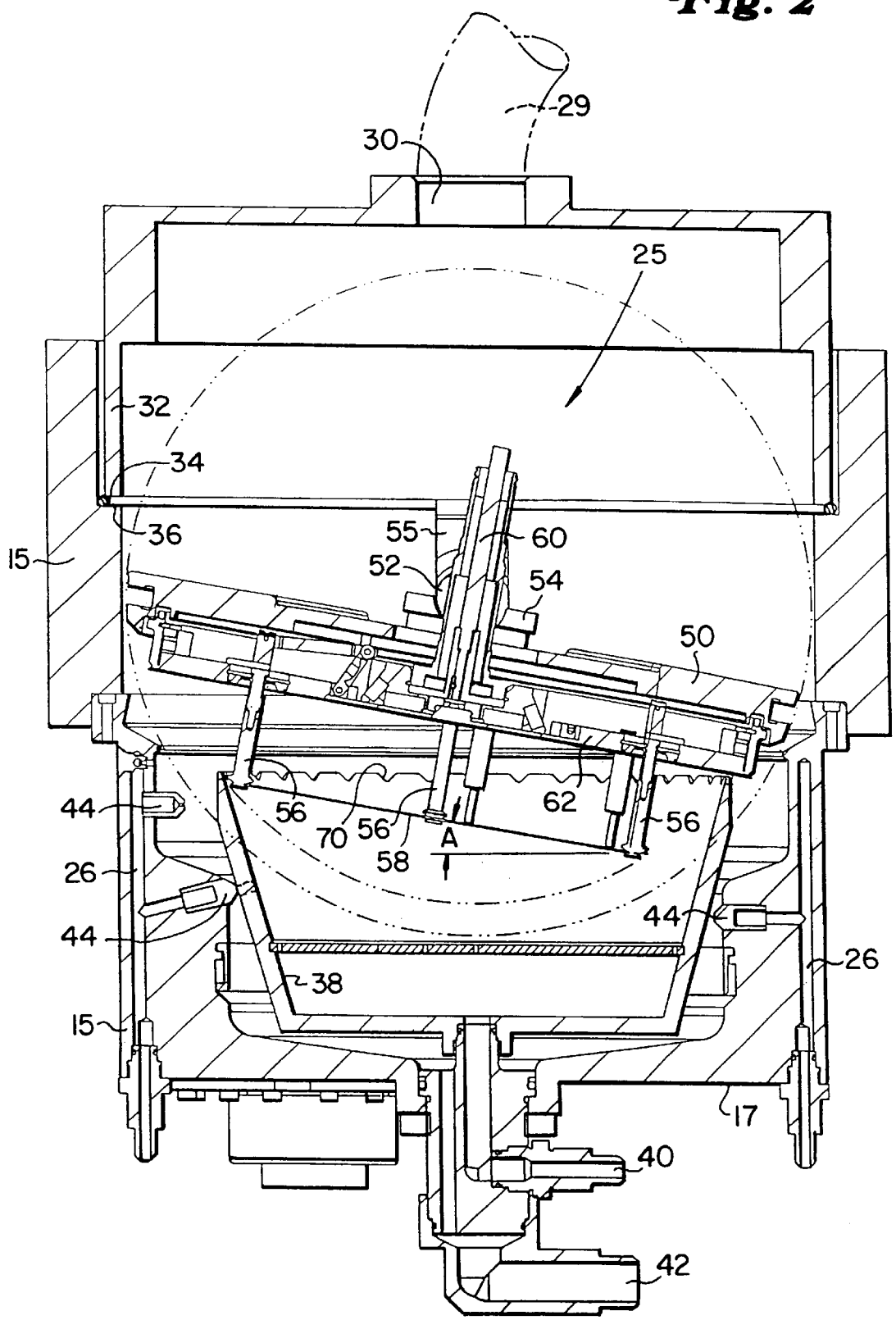
FIG. 2 is a section view taken along line 2—2 of FIG. 1, and showing the dryer in a closed position.
Figure 3:
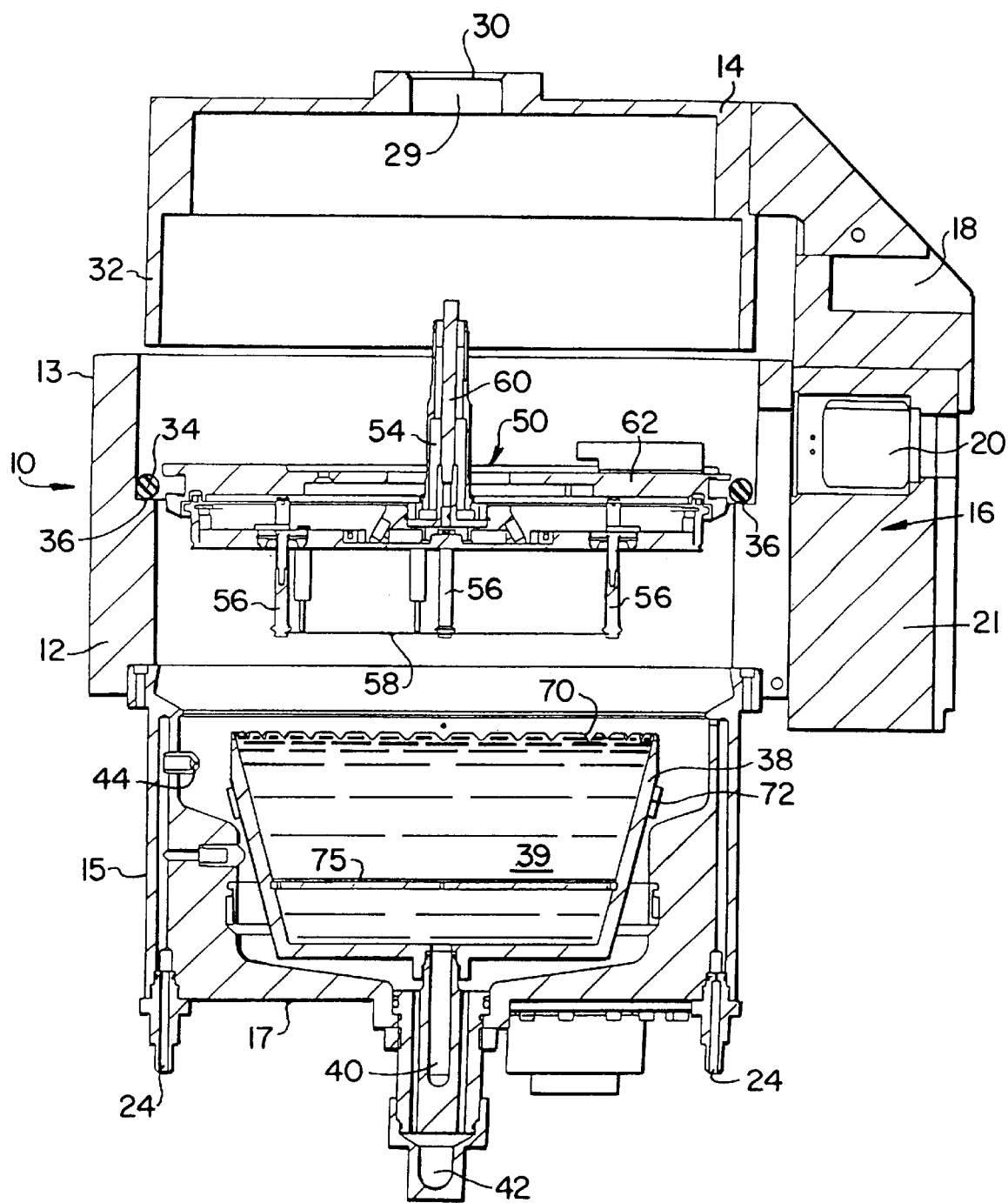
FIG. 3 is a section view taken along line 3—3 of FIG. 1, and showing the dryer with the lid moving into an open position.

Referring to FIGS. 1–3, a bottom section 17 is joined to the lower cylindrical side wall 15. A basin 38 is provided within the body 12. The basin 38 has serrations or notches 70 at its upper rim. An inlet 40 connects a rinsing liquid source, such as deionized water, into the basin 38. Similarly, a drain 42 extends from the bottom of the basin 38 to a facility drain. Vapor/gas inlets 24 are connected to nozzles 44 through ducts 26.

A seal or O-ring 34 on an inner rim 36 of the upper cylindrical side wall 13 closes off the body 12 when the lid 14 is brought down to a closed position, with the body 12 then forming an enclosed chamber 25. Specifically, an annular lid extension 32 on the lid 14 engages against the O-ring 34, when the lid 14 is in the down or closed position (as shown in FIG. 2).

The chamber 25, although closed off, need not be sealed in all cases. Rather, it is closed off sufficiently to inhibit variations in processing resulting from e.g., intrusion of clean room air into the chamber, etc.

Referring to FIGS. 2 and 3, a rotor assembly 50 within the body 12 or chamber 25 is supported on a pivot axle 52. The rotor assembly 50 includes a rotor plate 62 attached to a spin shaft 60 extending through a spin motor 54. Fingers 56 on the rotor plate 62 hold a wafer 58, or other flat media article.

The pivot axle 52 extends through a vertical slot 55 in the upper cylindrical side wall 13, and is attached to an elevator 16 on the outside of the body 12. The vertical slot 55 is preferably closed off or sealed with a bellows or similar component which allows for vertical translation and pivoting movement of the pivot axle 52, while largely preventing vapors or gases from passing into or out of the chamber 25. The elevator 16 has a pivot motor 20 for turning or pivoting (in elevation) the pivot axle 52 and the rotor assembly 50. The elevator 16 also has a linear lift motor 21 attached to the pivot axle 52 and pivot motor 20, so that the rotor assembly 50 within the chamber 25 can be raised and lowered, (along with the pivot axle 52 and pivot motor 20).

An exhaust duct 29 connects an exhaust port 30 in the lid 14 to a facility vapor/gas removal or recovery.

The spin motor 54 may be an electric motor powered via wires extending from the spin motor 54 through the pivot axle 52 and making electrical connections with a power source in the elevator 16. Alternatively, the spin motor 54, pivot motor 20, and lift motor 21, may be electrical, fluid driven or pneumatic.

In use, the processor 10 processes one wafer at a time. The lid 14 is raised up and/or pivoted open via the lid actuator 18. The rotor assembly 50 is in a right side up position, i.e., with the fingers 56 facing up, to receive a wafer 58. A wafer, to be processed, is placed into the fingers 56, either manually, or via a robot. The fingers 56 secure the wafer to the rotor assembly 50. The pivot motor 20 is energized, turning the pivot axle 52 and rotor assembly 50, so that the rotor assembly 50 pivots into a face down position (as shown in FIG. 3). The lid actuator 28 closes the lid 14, with the lid extension 32 sealing the lid 14 against the upper cylindrical side wall 13 of the body 12.

When used for cleaning, a rinsing fluid, such as DI water, fills the basin 38 via entry through the inlet 40. A diffuser plate 75 provides for more even upflow of fluid, as the fluid fills the basin. The lift motor 21 is energized to lower the rotor assembly 50, so that the wafer 58 is immersed into the rinsing liquid 39. The basin 38 is preferably overflowing with the DI water or processing fluid. A surface tension gradient is created between the interface at the liquid-solid-gas contact line, and the free liquid surface away from the contact line. The gradient is created and sustained by providing a continuous exchange of the meniscus, by overflowing the DI water or fluid. The notches 70 at the upper rim of the basin provide a uniform extraction of the surface layer of the fluid, to remove any accumulated impurities or organic concentration. This maintains a uniform surface tension gradient.

More than one process fluid can be used in the basin, with the wafer remaining in the basin, for multiple process steps using multiple fluids, before the wafer is extracted and dried. Megasonic transducers 72 may be provided on the basin, to provide a cleaning process, before drying.

The term "wafer" here means any flat media such as semiconductor wafers, photomasks, flat panel displays, memory disks, CD glass, etc.

If the rotor assembly 50 is horizontal, as shown in FIG. 3, the pivot motor 20 is actuated to pivot the rotor assembly, so that the wafer 58 is moved into an inclined angle A, from horizontal, as shown in FIG. 2. The inclined angle A is preferably in the range of 3–45° from horizontal, more preferably in the range of 5–30°, and still more preferably between 5–15°, with 10° being suitable for many applications.

The lift motor 21 is then reversed to lift the rotor assembly 50 up, thereby withdrawing the wafer 58 from the rinsing liquid 39, while the wafer 58 is maintained at the inclined angle A.

A vapor of an organic solvent, preferably isopropyl alcohol, is introduced into the environment around the wafer 58, within the chamber 25, by the vapor ducts 26 and nozzles 44. The vapor is introduced into the basin 38 at a position at or just above the surface of the rinsing liquid 39. The vapor should be non-condensing, and is preferably mixed with nitrogen or other non-reacting gas.

The lift motor 21 continues to lift the rotor assembly 50, until the wafer 58 is entirely withdrawn from the rinsing liquid 39. The spin motor 54 is then turned on briefly, to fling off any liquid remaining on the wafer 58. The spin time is limited, to avoid allowing any liquid to dry on the wafer 58. The spinning of the wafer 58 may take place with the rotor assembly 50 at any position or incline angle, or even while the rotor assembly is pivoting. However, spinning is preferably done with the wafer either horizontal, or at the inclined angle A. The wafer 58 is preferably spun at from 300–1800 rpm, preferably at 500–800 rpm, for an interval from 5–30 seconds, or for the least amount of time necessary to remove any remaining liquid from the wafer. As in practice, any remaining liquid tends to be located near the peripheral edges of the wafer 58, only very brief spinning is needed. Consequently, the disadvantages of liquid drying on the wafer are avoided.

The rotor assembly 50 may be upside down, as shown in FIGS. 2 and 3, or right side up, during spinning of the wafer. After spinning, the lid 14 is reopened, so that the dry wafer can be removed from the dryer 10. The rinsing liquid 39 is drained from the basin 38 through the drain pipe 42. Fresh rinsing liquid may then be supplied to the basin 38, for processing the next wafer.

By withdrawing the wafer 58 at the inclined angle, a continuous linear meniscus of rinsing liquid 39 is formed on the wafer surface, minimizing droplets left on the wafer. The rate of lift or withdrawal of the wafer from the rinsing liquid 39 is controlled to maintain the continuous meniscus. The solvent vapor reduces the surface tension of the rinsing liquid, causing the liquid to more easily run off the wafer. Spinning the wafer centrifugally removes any remaining liquid from the wafer. It also removes any remaining rinsing or other processing liquid from the rotor and other components supporting the wafer. This avoids the need for intricate self draining designs for the fingers and other wafer supporting elements. As the chamber 25 is substantially enclosed when the dryer 10 is in operation, release of the solvent vapor (and other chemicals if used) is minimized or prevented. The exhaust duct 29 on the lid 14 exhausts gases and vapors from the chamber 25 in a controlled manor.

When used for other semiconductor manufacturing steps, process chemicals in fluid form are used instead of a rinsing liquid.

Thus, a novel method and apparatus for processing and for drying semiconductor wafers, and similar articles, has been shown and described. Various changes and modifications may of course be made, without departing from the spirit and scope of the invention. The invention, therefore, should not be limited, except by the following claims, and their equivalents.

What is claimed is:

1. An apparatus for processing a semiconductor article, comprising:
    means for withdrawing the article from a bath of processing fluid at an inclined angle at a selected withdrawal rate;
    means for exposing the article to a vapor of an organic solvent above the bath; and
    means for removing any remaining droplets of the fluid from the article by momentarily spinning the article.

2. The apparatus of claim 1 further comprising an enclosure for containing the vapor.

3. The apparatus of claim 1 wherein the inclined angle is from 5–45°.

4. The apparatus of claim 1 further including a spray nozzle for spraying the solvent vapor.

5. An apparatus for processing an article, comprising:
    a basin;
    a rotor above the basin for holding and spinning an article;
    a pivot drive for pivoting the rotor into a position where the rotor holds the article at an inclined angle;
    an elevator for lowering the rotor to immerse the article into a liquid within the basin, and for raising the rotor to remove the article from the liquid at the inclined angle.

6. The apparatus of claim 5 wherein the inclined angle is from 3–45° from horizontal.

7. The apparatus of claim 5 wherein the rotor is adapted to spin the article at the inclined angle.

8. The apparatus of claim 5 further comprising fingers on the rotor for holding the article.

9. The apparatus of claim 5 further comprising a lid moveable to enclose the basin to prevent escape of vapors from the basin.

10. The apparatus of claim 9 further comprising a body around the basin, wherein the lid is engageable with the body to enclose the basin.

11. The apparatus of claim 5 further comprising a spin motor attached to the rotor.

12. The apparatus of claim 5 further comprising a spray nozzle in the basin for spraying a solvent vapor onto the article.

13. An apparatus for processing an article, comprising:
   means for lowering the article into a basin filled with a processing fluid, and for raising the article out of the basin;
   means for pivoting the article into an inclined angle before the article is raised out of the basin; and
   means for removing fluid from the article by spinning the article.

14. The apparatus of claim 13 further comprising means for exposing the article to a vapor of an organic solvent disposed above the basin.

15. The apparatus of claim 14 further comprising an enclosure for containing the vapor.

16. The apparatus of claim 13 wherein the inclined angle is from 3–45° from horizontal.

17. An apparatus for processing an article, comprising:
   a basin containing a processing fluid;
   a rotor above the basin for holding and spinning an article, the rotor pivotable to a position where the rotor holds the article at an inclined angle;
   means for lowering the rotor to immerse the article into the processing fluid, and for raising the rotor to remove the article from the processing fluid at the inclined angle.

18. The apparatus of claim 17 further comprising means for pivoting the rotor into the inclined angle.

19. The apparatus of claim 17 wherein the inclined angle is from 3–45° from horizontal.

20. The apparatus of claim 17 further including means for supplying an organic solvent vapor around the rotor.

\* \* \* \* \*